US005527988A

United States Patent [19]

Hernandez et al.

[11] Patent Number: 5,527,988

[45] Date of Patent: Jun. 18, 1996

[54] TANK FOR AN OIL-FILLED, PAD-MOUNTED ELECTRICAL DISTRIBUTION TRANSFORMER

[75] Inventors: Augusto D. Hernandez, Waukesha; Richard M. Marusinec, Delafield, both of Wis.

[73] Assignee: Cooper Industries, Inc., Houston, Tex.

[21] Appl. No.: 117,752

[22] Filed: Sep. 8, 1993

[51] Int. Cl.[6] .......... H05K 5/04

[52] U.S. Cl. .......... 174/17 LF; 174/50; 336/90

[58] Field of Search .......... 174/17 LF, 50; 336/90; 220/DIG. 13, 1.5

[56] References Cited

U.S. PATENT DOCUMENTS

| | | | |
|---|---|---|---|
| 2,433,917 | 1/1948 | McCartney | 174/50 X |
| 2,796,560 | 6/1957 | Klose | 336/90 X |
| 3,059,803 | 10/1962 | Holsinger | 174/50 X |
| 3,905,001 | 9/1975 | Sato et al. | 174/17 LF X |
| 4,005,341 | 1/1977 | Uptegraff, Jr. et al. | 336/90 X |
| 4,190,732 | 2/1980 | Galloway et al. | 174/17 LF |
| 4,497,387 | 2/1985 | Reiplinger | 336/90 X |
| 4,533,786 | 8/1985 | Borgmeyer et al. | 174/50 |
| 4,556,758 | 12/1985 | Warden | 174/50 |
| 4,963,696 | 10/1990 | Owen et al. | 174/50 |

*Primary Examiner*—Kristine L. Kincaid
*Assistant Examiner*—Paramita Ghosh
*Attorney, Agent, or Firm*—Burns, Doane, Swecker & Mathis

[57] ABSTRACT

A tank for an oil-filled, pad-mounted electrical transformer includes six sides. The tank includes a front plate and a side panel unit connected to the front plate. The side panel unit is formed of a bent sheet of metal. Two of the side panels form obtuse included angles with adjoining side panels. A floor plate of the tank is sized to fit inside of the side panel unit so as to be capable of being secured at any desired elevation. The floor plate includes reinforcing channels.

16 Claims, 3 Drawing Sheets

FIG. 1
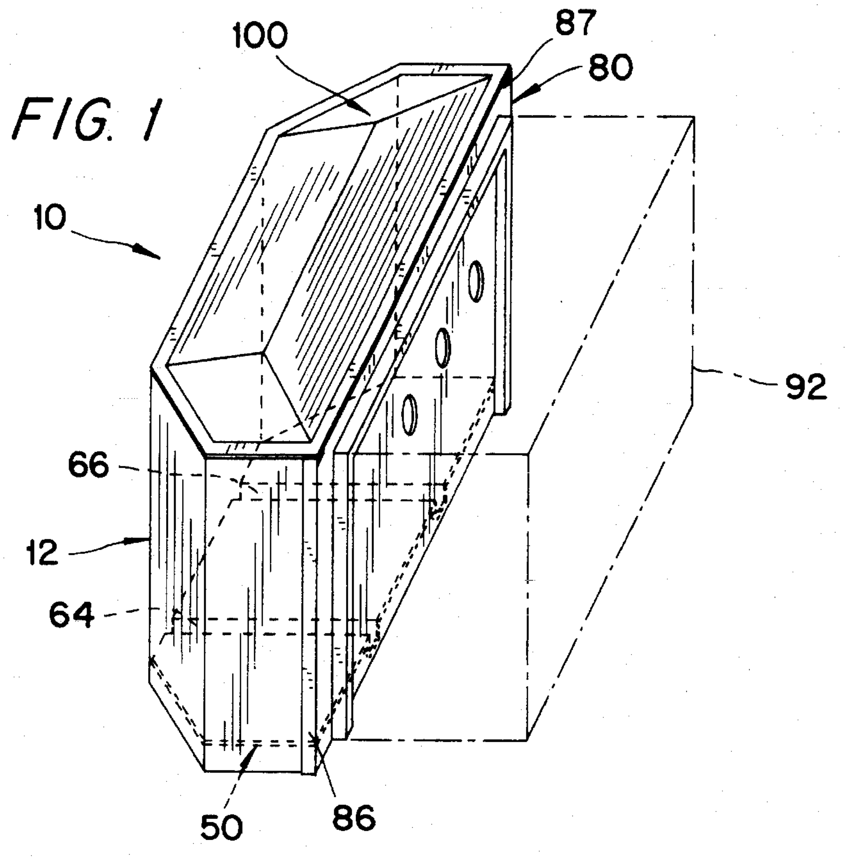
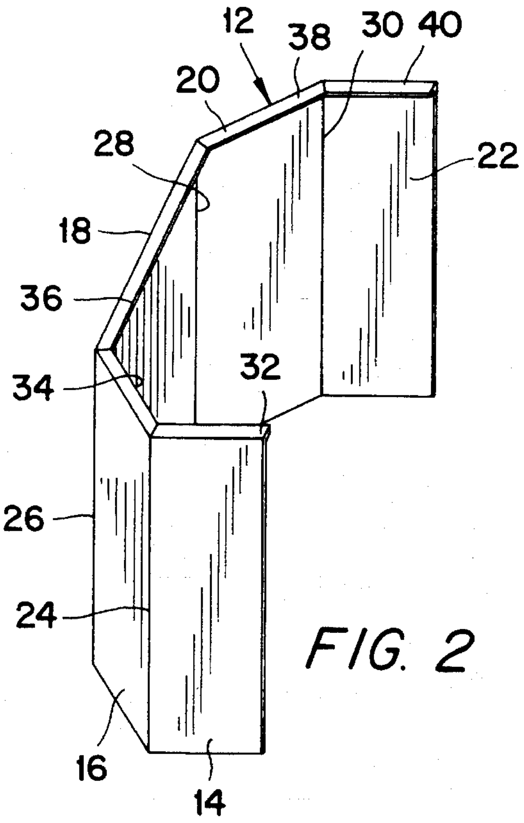
FIG. 2
FIG. 3
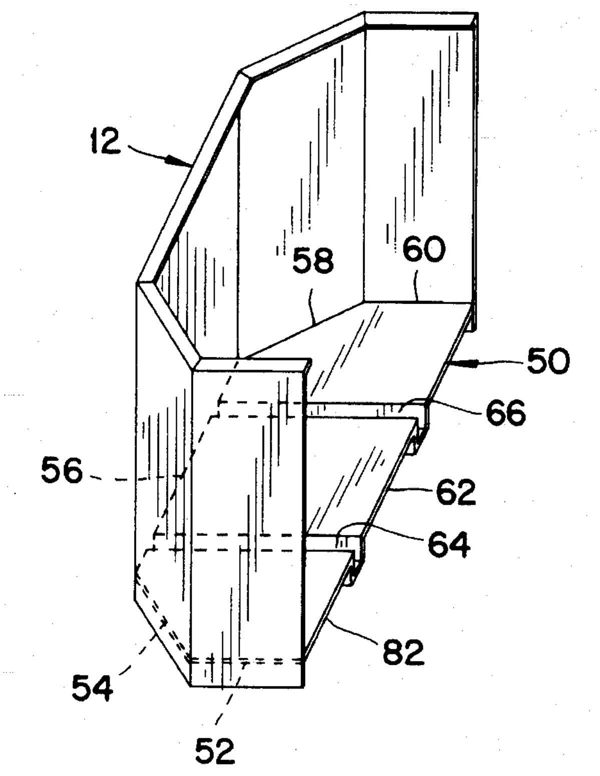

TANK FOR AN OIL-FILLED, PAD-MOUNTED ELECTRICAL DISTRIBUTION TRANSFORMER

BACKGROUND OF THE INVENTION

The present invention relates to oil-filled, pad-mounted electrical distribution transformers and in particular to a tank for such transformers.

A transformer tank is designed to house a transformer electrical core and coils. Conventional tanks are formed in the shape of a rectangular cube and comprise four vertical side walls, a horizontal top wall, and a horizontal bottom wall. During assembly, five of those walls are preassembled together by welding, leaving an opening to permit subsequent insertion of the core and coil assembly. Usually, the opening is provided at the top, although in some cases, it can be provided at one of the sides.

After that open structure has been leak tested, the transformer core and coil may be placed inside the tank through the open top. Then, utilizing holes formed in the front plate, the usual electrical connections are made, and the appropriate accessories are installed. The tank is then filled with oil to a prescribed level, and the top wall, e.g., a substantially flat or domed cover, is placed on flanges formed by bent upper ends of the side panels and is welded in place. The tank is then coated with a corrosion resistant film.

Since transformer tanks are often located in areas to which the general public has access, the presence of sharp corners on the tanks is avoided as much as possible. One way of avoiding the presence of sharp corners between the side panels is to form those panels of a single piece of sheet metal bent twice to form two rounded vertical corners (e.g. See Borgmeyer et al U.S. Pat. No. 4,533,786). Also, the floor plate and front plate could be integrally formed by bending a single metal sheet.

The width and height of the front plate are dictated by electrical and mechanical clearances between certain parts. For a given size transformer, the maximum horizontal depth of the tank interior is governed by necessary electrical and mechanical clearances for the core and coil. Therefore, the internal volume of the tank typically ends up being so large that it is necessary in some cases to add reinforcing members to prevent the vertical side panels and floor plate from being deformed by internal and external pressures.

Also, there is a risk of the floor plate becoming corroded due to contact thereof with water and other corrosive elements disposed on the surface of the pad support upon which the transformer is seated. If such corrosion is not detected at an early stage, there is a risk of the tank developing leaks through the floor plate.

Therefore it would be desirable to minimize or eliminate problems of the type discussed above, and to otherwise improve transformer tanks.

SUMMARY OF THE INVENTION

The present invention relates to a transformer tank for an oil-filled, pad-mounted electrical distribution transformer. The transformer tank comprises a front plate for supporting electrical connectors, and at least five interjoined side panels. Two of the side panels are affixed to the front plate, and at least two others of the side panels each forms an obtuse included angle with adjoining ones of the side panels. The tank further comprises a floor plate which defines a floor of the tank, and a cover which overlies an interior volume defined by the front plate, side panels, and floor plate.

Preferably, each of the obtuse angles is about 135°.

Each of the side panels preferably includes a vertical planar portion and a flange portion extending horizontally from the top of the vertical planar portion.

The side panels are preferably formed of a single bent sheet of metal.

The floor plate preferably fits inside of a space formed by the front plate and side panels and is situated at an elevation higher than bottom-most edges of the side panels.

The floor plate preferably includes a plurality of upwardly open channels each extending in a direction perpendicular to a plane of the front plate for the entire extent of the bottom plate in that direction.

BRIEF DESCRIPTION OF THE DRAWING

The objects and advantages of the invention will become apparent from the following detailed description of a preferred embodiment thereof in connection with the accompanying drawing in which like numerals designate like elements and in which:

FIG. 1 is a top perspective view of a transformer tank according to the present invention;

FIG. 2 is a top perspective view of a side panel unit of transformer tank;

FIG. 3 is a top perspective view of the side panel unit after a floor panel has been welded thereto;

DETAILED DESCRIPTION OF A PREFERRED EMBODIMENT OF THE INVENTION

Figure 4:
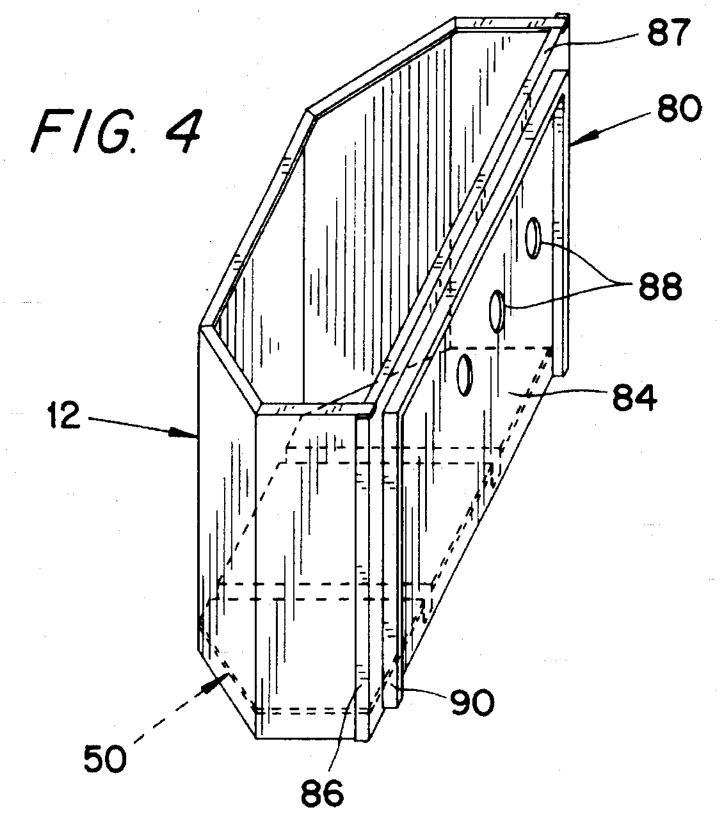
FIG. 4 is a top plan view of the structure depicted in FIG. 3 after a front plate has been welded thereto.

A tank 10 for housing an oil-filled, pad-mounted electrical distribution transformer core and coils is depicted in FIG. 1. Steps involved in making the tank are depicted in FIGS. 2–4. FIG. 2 depicts a side panel unit 12 comprised of a metal sheet (e.g. steel) which has been bent four times to form five side panels 14, 16, 18, 20, 22 which are separated by four vertical corners 24, 26, 28, 30. Upper edges of the panels have been bent at right angles to form five horizontal flanges 32, 34, 36, 38, 40. Each side panel thus comprises a vertical planar portion and a flange extending horizontally from an upper end of the vertical portion.

Figure 5:
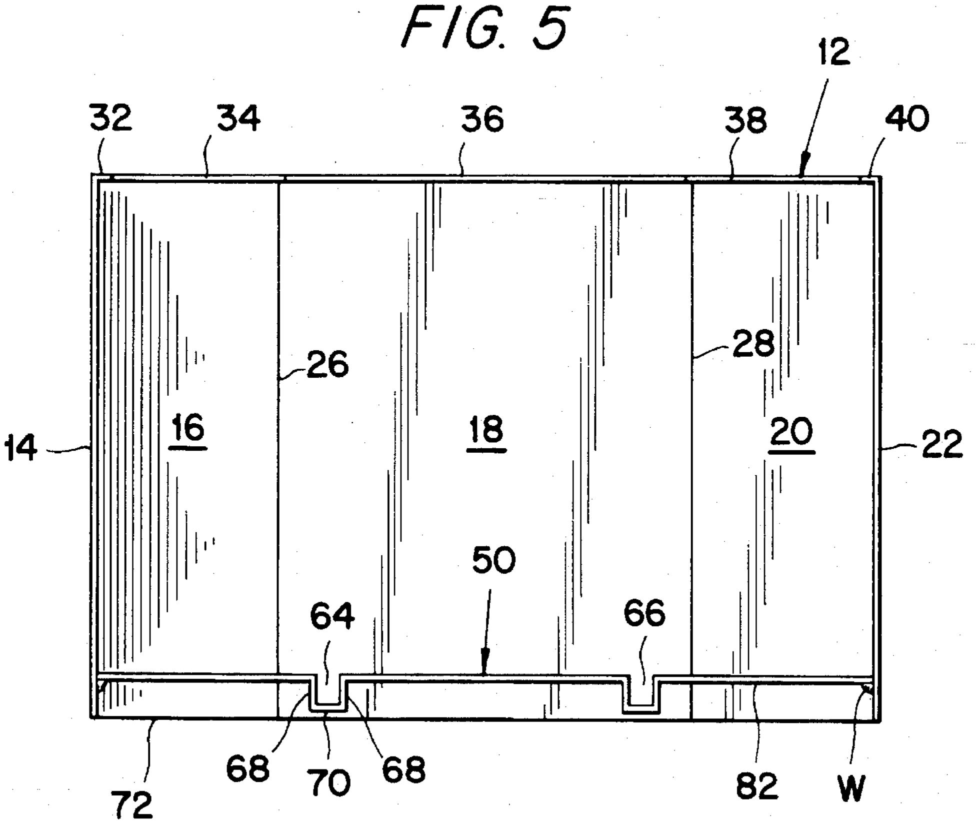
FIG. 5 is a front elevational view of the structure depicted in FIG. 3.

Depicted in FIGS. 3 and 5 is the side panel unit 12 into which a steel floor plate 50 has been welded at W. The floor plate has six peripheral edges 52, 54, 56, 58, 60, 62, five of which (52–60) bear against inside faces of respective ones of the side panels 14, 16, 18, 20, 22. The floor plate 50 includes two open-ended, upwardly open channels 64, 66 extending for the entire horizontal depth of the floor plate. Each channel is U-shaped and includes two downwardly depending legs 68 interconnected by a bottom 70. The floor plate 50 is preferably positioned at a sufficiently high elevation that the bottoms 70 of the channels are spaced above the lower edge 72 of the side panel unit 12, as depicted in FIG. 5. The actual elevation of the floor plate 50 may vary, depending upon the size of the transformer core and coils, as will be later discussed.

Depicted in FIG. 4 is the assembly 12, 50 of FIG. 3 after a steel front plate 80 has been welded to front portions of the panels 14 and 22 and the front edge 82 of the floor plate 50.

It will be appreciated that the side panels 14 and 22 project perpendicularly from the plane of the front plate 80, and the side panel 18 lies parallel to that plane.

The front plate 80 is of conventional design and includes a front wall portion 84 two vertical peripheral edges 86, and one horizontal top edge 87. The edges 86 have been bent at right angles to form flanges which overlap with outer faces of the panels 14, 22. The horizontal flange 87 has been bent to form a horizontal flange. The ends of that horizontal flange have been notched to receive the front ends of the flanges 32 and 40 of the side panel unit 12 (see FIG. 4). Thus, the top faces of the flanges 87, 32, 34, 36, 38, 40 are coplanar and define a flat support surface for supporting a cover, as will be discussed. The front wall portion 84 contains a plurality of holes 88 for receiving various electrical connectors (not shown) such as high and low voltage bushings, for example. The front portion also carries a flange 90 to which can be mounted a front cabinet 92 (shown in phantom in FIG. 1) which conceals the bushings. The cabinet typically includes a door which affords access to the bushings.

The assembly 12, 50, 80 shown in FIG. 4 (and in top plan view in FIG. 8) is leak tested and then coated with a suitable corrosion resistant substance. During the application of the coating, the top flanges 32–40 of the side panel unit 12 and the top flange 87 of the front plate 80 are masked.

Figure 8:
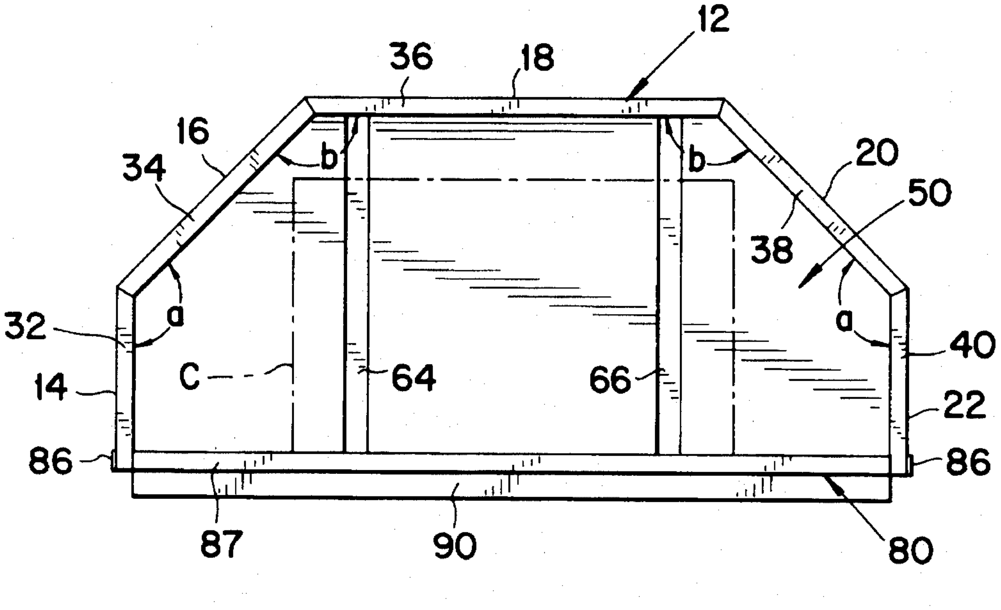
FIG. 8 is a top plan view of the structure depicted in FIG. 4.

At this point, the transformer core and coil assembly C, shown in phantom in FIG. 8, is placed inside the tank, and the required accessories are installed and electrical connections are provided through the holes in the front plate. Then, the tank is filled with insulating oil to the appropriate level.

Figure 6:
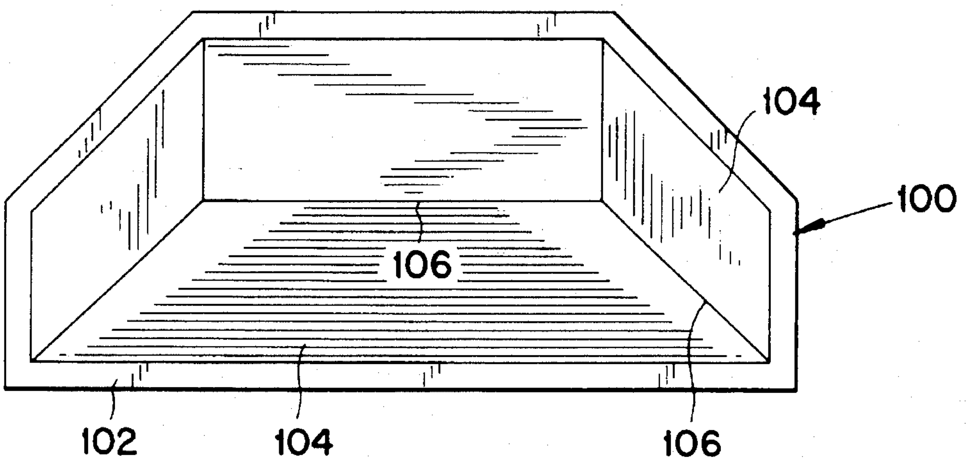
FIG. 6 is a top view of a cover of the transformer tank.
Figure 7:
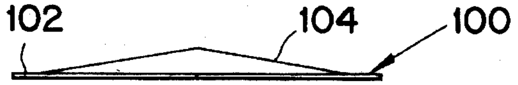
FIG. 7 is a side elevational view of the cover depicted FIG. 6.

Thereafter, a steel cover 100 (shown in FIGS. 1, 6 and 7) is placed upon a support surface defined by the horizontal top flanges 32–40 of the side panel unit 12 and flange 87 of the front plate and is welded in place. The cover 100, which is of conventional design, has a dome-like configuration which is particularly evident in FIG. 7. The cover also has a horizontal outside rim 102 which surrounds an inner portion that is bent to form a plurality of planar panels 104 projecting upwardly at an inclination toward one another. Those panels intersect to form various corners 106 located above the plane of the rim 102.

When the cover 100 is placed upon the flanges 32–40 of the side panel unit 12, and the flange 87 of the front plate 80, the rim 102 will rest flat on the surface defined by those flanges. The cover 100 will then be welded to the flanges 32–40 and 87, and the unit leak tested. The cover 100 will then be coated with a conventional corrosion resistant substance.

The dome-like shape of the cover enables the cover to more easily shed moisture, and minimizes any downward deflection which could occur in response to the creation of a vacuum within the tank (e.g. resulting from thermal contraction of the insulating oil), which deflection could produce an unwanted moisture-collecting depression in the cover.

The tank 12 can be provided with suitable brackets (not shown) which enable the transformer to be lifted. For example, the brackets could be mounted in the side panels 14 and 22.

The tank 10 according to the present invention exhibits improved strength and corrosion-resistant characteristics, and enables the internal volume of the tank to be reduced.

The improved strength and volume-reducing characteristics result from the provision of a side panel unit comprised of more than the standard three panels (in the illustrated embodiment, five side panels 14–22 have been provided) with two of the panels 16, 20 each forming included obtuse angles a, b with its adjacent panels, as depicted in FIG. 8. Such a configuration results in a six-sided, six-cornered structure which is of superior structural strength to the previously described conventional four-sided tank having three side panels interconnected by rounded corners. In effect, the present invention serves to break-up the back side of the tank into three panels 16, 18, 20, each of which is significantly narrower than the back side of a standard four-sided tank. Such a configuration according to the present invention is structurally stronger, exhibiting lower deflection and mechanical stress under the influence of internal and external pressure without requiring the provision of extra reinforcing members. Hence, the cost and complexity of building the tank are minimized.

Furthermore, the provision of obtusely oriented side panels 16, 20 reduces the internal volume of the tank as compared with standard four-sided tanks, thereby enabling the insulating requirements to be met by filling the tank with a smaller volume of insulating oil.

The magnitudes of the angles a and b for achieving the above benefits can vary, but preferably each of those angles a, b is 135 (one-hundred thirty five) degrees. Each of the panels 16, 20 which forms those two angles a, b should preferably be spaced from the front plate 80 by at least one other side panel (e.g. by panels 14 and 22 in the illustrated embodiment).

The floor plate 50 also exhibits unique advantages. Since that floor plate 50 is disposed internally of the structure formed by the side panels 14–22 and front plate 80, it can be positioned at any desired elevation prior to being welded in place. Thus, the entire floor plate can be placed at a higher elevation than the bottom edge 72 of the tank and thus be isolated from any moisture or other corrosive substances situated on the support pad. Thus, the floor plate will be less susceptible to corrosion as compared to conventional transformer tanks in which the floor plate is flush (coplanar) with the bottom edge of the tank. Of course the bottom edge 72 of the tank 12 according to the present invention will come into contact with moisture disposed on the pad, but resulting corrosion of that edge 72 would not create an immediate risk of leakage as would be the case if the floor plate itself were being corroded. Hence, an additional opportunity would be provided to detect the corrosion before tank leakage occurs.

Additionally, the ability to mount the floor plate at any desired elevation enables the volume of the tank to be varied without affecting the dimensions of the front plate 80.

Thus, a core and coil assembly having a lower overall height may be placed in a shallower tank (created by raising the floor plate) without having to modify the front plate; the transformer would possess the same electrical connection lead lengths as a taller core and coil assembly. This enables a single tank design to be adapted to different core and coil sizes, and enables the required oil volume to be reduced.

The channels 64, 66 formed in the floor plate provide a convenient way of increasing the strength of the floor plate without the need for attaching additional reinforcing members. That is, the channels increase the stiffness and bending resistance of the floor plate. Although the stiffening channels are formed with vertical sides and a flat bottom, they could have any suitable convex shape. For example, the vertical sides could be sloped so as to converge downwardly, and the corners could be radiused to facilitate welding of the bottom plate smoothly without interruption of the arc.

It will thus be appreciated that the present invention enables the strength of a pad-mounted transformer tank to be increased and the required oil volume to be decreased. Additionally, the floor plate is made less susceptible to the effects of corrosive substances disposed on the pad. Furthermore, a single tank design can be adapted to house transformers having a core and coils of varying sizes.

Although the present invention has been described in connection with a preferred embodiment thereof, it will be appreciated by those skilled in the art that additions, deletions, modifications, and substitutions not specifically described may be made without departing from the spirit and scope of the invention as defined in the appended claims.

What is claimed is:

1. An electrical distribution transformer comprised of a pad-mounted transformer tank and a transformer core and coils submersed within insulating oil inside said tank, said transformer tank comprising:

a front plate for supporting electrical connectors, at least five interjoined side panels, two of said side panels being affixed to said front plate, and at least two others of said side panels each forming an obtuse included angle with adjoining ones of said side panels, a floor plate defining a tank floor connected to lower ends of said side panels such that each of said side panels extends in an upward direction from said floor plate, and a cover connected to upper portions of said side panels and said front plate and overlying an interior volume defined by said front plate, said side panels, and said floor plate.

2. A transformer according to claim 1, wherein each of said obtuse angles is about one-hundred thirty-five degrees.

3. A transformer according to claim 1, wherein each of said at least five side panels includes a vertical planar portion and a flange portion extending horizontally from the top of said vertical planar portion.

4. A transformer according to claim 3, wherein said cover is seated on said flange portions.

5. A transformer according to claim 1, wherein said side panels comprise respective sections of a single bent sheet of metal.

6. A transformer according to claim 1, wherein there are no more than five side panels.

7. A transformer according to claim 1, wherein said floor plate fits inside of a space formed by said front plate and said side panels and is situated at an elevation higher than bottom-most edges of said side panels.

8. A transformer according to claim 7, wherein said floor plate includes at least one upwardly open channel extending in a direction perpendicular to a plane of said front plate for the entire extent of said floor plate in said direction.

9. A transformer tank for an oil-filled pad-mounted electrical distribution transformer, said transformer tank comprising:

a front plate for supporting electrical connectors, five interjoined side panels, first and second ones of said side panels being affixed to said front plate and extending perpendicular thereto, a third side panel extending perpendicular to said first and second side panels and situated rearwardly thereof, a fourth side panel joining said first and third panels together and forming with each of said first and third panels an included angle of about 135 degrees, a fifth side panel joining said second and third panels together and forming with each of said second and third panels an included angle of about 135 degrees, a floor plate defining a tank floor and fitting inside of a space formed by said front plate and said side panels, said floor plate being situated at an elevation higher than bottom-most edges of said side panels, and a cover overlying an interior volume defined by said front plate, said side panels, and said floor plate.

10. A transformer tank according to claim 9, wherein each of said five side panels includes a vertical planar portion and a flange extending horizontally from the top of said vertical planar portion.

11. A transformer tank according to claim 10, wherein said cover is seated on said flanges.

12. A transformer tank according to claim 9, wherein said side panels comprise respective sections of a bent sheet of metal.

13. A transformer tank according to claim 9, wherein said floor plate includes a plurality of upwardly open channels each extending in a direction perpendicular to a plane of said front plate for the entire extent of said floor plate in said direction.

14. A transformer tank according to claim 13, wherein said side panels comprise respective sections of a single bent sheet of metal.

15. A transformer tank for an oil-filled, pad-mounted electrical distribution transformer, said transformer tank comprising:

a front plate for supporting electrical connectors, at least five interjoined side panels, two of said side panels being affixed to said front plate, and at least two others of said side panels each forming an obtuse included angle with adjoining ones of said side panels, a floor plate defining a tank floor connected to lower ends of said side panels such that each of said side panels extends in an upward direction from said floor plate, and a cover connected to upper portions of said side panels and said front plate and overlying an interior volume defined by said front plate, said side panels, and said floor plate, wherein each of said at least five side panels includes a vertical planar portion and a flange portion extending horizontally from the top of said vertical planar portion.

16. A transformer tank for an oil-filled, pad-mounted electrical distribution transformer, said transformer tank comprising:

a front plate for supporting electrical connectors, at least five interjoined side panels, two of said side panels being affixed to said front plate, and at least two others of said side panels each forming an obtuse included angle with adjoining ones of said side panels, a floor plate defining a tank floor connected to lower ends of said side panels such that each of said side panels extends in an upward direction from said floor plate, and a cover connected to upper portions of said side panels and said front plate and overlying an interior volume defined by said front plate, said side panels, and said floor plate, wherein said floor plate fits inside of a space formed by said front plate and said side panels and is situated at an elevation higher than bottom-most edges of said side panels.

* * * * *